United States Patent [19]
Chawla et al.

[11] Patent Number: 5,661,412
[45] Date of Patent: Aug. 26, 1997

[54] REDUCING PROGRAMMING TIME OF A FIELD PROGRAMMABLE GATE ARRAY EMPLOYING ANTIFUSES

[75] Inventors: Amarpreet S. Chawla, Sunnyvale; Richard J. Wong, Milpitas; Andrew K. Chan, Palo Alto, all of Calif.

[73] Assignee: QuickLogic Corporation, Sunnyvale, Calif.

[21] Appl. No.: 541,662

[22] Filed: Oct. 10, 1995

[51] Int. Cl.⁶ .................. H03K 19/177; G11C 17/14
[52] U.S. Cl. .................................... 326/38; 364/489
[58] Field of Search .................. 326/38; 364/480, 364/481, 482, 488, 489, 490

[56] References Cited

U.S. PATENT DOCUMENTS

| | | | |
|---|---|---|---|
| 4,569,120 | 2/1986 | Stacy et al. | 29/574 |
| 5,008,855 | 4/1991 | Eltoukhy et al. | 365/96 |
| 5,083,083 | 1/1992 | El-Ayat et al. | 324/158 |
| 5,126,282 | 6/1992 | Chiang et al. | 437/172 |
| 5,130,777 | 7/1992 | Galbraith et al. | 357/51 |
| 5,194,759 | 3/1993 | El-Ayat et al. | 307/202 |
| 5,208,530 | 5/1993 | El-Ayat et al. | 324/158 |
| 5,223,792 | 6/1993 | El-Ayat et al. | 324/158 |
| 5,243,226 | 9/1993 | Chan | 307/465 |
| 5,257,225 | 10/1993 | Lee | 365/185 |
| 5,272,388 | 12/1993 | Bakker | 307/202 |
| 5,293,133 | 3/1994 | Birkner et al. | 324/713 |
| 5,299,150 | 3/1994 | Galbraith et al. | 365/94 |
| 5,302,546 | 4/1994 | Gordon et al. | 437/170 |
| 5,309,091 | 5/1994 | El-Ayat et al. | 324/158 |
| 5,316,971 | 5/1994 | Chiang et al. | 437/170 |
| 5,327,024 | 7/1994 | Cox | 307/465 |
| 5,341,092 | 8/1994 | El-Ayat et al. | 324/158 |
| 5,349,248 | 9/1994 | Parlour et al. | 307/465 |
| 5,365,165 | 11/1994 | El-Ayat et al. | 324/58 |
| 5,371,414 | 12/1994 | Galbraith | 327/525 |
| 5,414,364 | 5/1995 | McCollum | 324/550 |
| 5,416,367 | 5/1995 | Chan et al. | 326/44 |
| 5,424,655 | 6/1995 | Chua et al. | 326/40 |
| 5,544,070 | 8/1996 | Cox et al. | 326/38 |

OTHER PUBLICATIONS

Actel Corporation, 1994 FPGA Data Book and Design Guide, "Testing and Programming Actel Field Programmable Gate Arrays (FPGAs)," pp. 4–1 through 4–8 (1993).
Actel Corporation, 1994 FPGA Data Book and Design Guide, "ACT Family Reliability Report," pp. 4–9 through 4–28 (1993).
Actel Corporation, 1994 FPGA Data Book and Design Guide, "Antifuse Field Programmable Gate Arrays," Green et al., pp. 4–29 through 4–43 (1993).
Actel Corporation, 1994 FPGA Data Book and Design Guide, "Oxide–Nitride–Oxide Antifuse Reliability," Chiang et al., pp. 4–45 through 4–51 (1993).

(List continued on next page.)

Primary Examiner—Edward P. Westin
Assistant Examiner—Benjamin D. Driscoll
Attorney, Agent, or Firm—Skjerven, Morrill, MacPherson, Franklin and Friel; T. Lester Wallace

[57] ABSTRACT

Critical programmed reliability of a metal-to-metal amorphous silicon antifuse is a function of programming current, operating current and total programming time. The time required to program a field programmable gate array is reduced by classifying antifuses to be programmed into three or more classes according to the amount of programming time required to achieve critical programmed reliability under programming current and operating current conditions. Each of these classes of antifuses is programmed with near the minimum programming time required to program every antifuse in the class to critical reliability. In this way, large numbers of antifuses are not programmed with significantly greater amounts of programming time than are actually required to program them to critical reliability. The time required to program the field programmable gate array is therefore reduced. Techniques for obtaining critical reliability data used in classifying antifuses are also disclosed. Classifications based on antifuse type, programming method, and operating conditions are also disclosed.

41 Claims, 5 Drawing Sheets

OTHER PUBLICATIONS

QuickLogic Corporation, 1994 QuickLogic Data Book, "pASIC 1 Family ViaLink Technology Very–High–Speed CMOS FPGAs," pp. 2–1 through 2–36 (1992).

QuickLogic Corporation, 1994 QuickLogic Data Book, "pASIC 1 Family Reliability Report," pp. 5–3 through 5–21 (1992).

Wong and Gordon, 1994 QuickLogic Data Book, "Conducting Filament of the Programmed Metal Electrode Amorphous Silicon Antifuse," pp. 6–3 through 6–10 (1992).

Wong and Gordon, 1994 QuickLogic Data Book, "Reliability Mechanism of the Unprogrammed Amorphous Silicon Antifuse," pp. 6–11 through 6–18 (1992).

```
forbidden = sqtLinkIsInTwilightZone(sqLink);
method0 = (dbgLinkMethod(link) = = PMDEFAULT);
cross = sqtLinkIsCross(sqLink);
pass = sqtLinkIsPass(sqLink);

if (prTwoBitProgram){
  forbidden2 = sqtLinkIsInTwilightZone(sqnLink);
  method02 = (dbgLinkMethod(nLink) = = PMDEFAULT);
  cross2 = sqtLinkIsCross(sqnLink);
  pass2 = sqtLinkIsPass(sqnLink);
} if (prTwoBitProgram) {
  if (!dbtLinkCritical(link) && !dbtLinkCritical(nLink)){
    if (sqtLinkIsInput(sqLink) && sqtLinkIsInput(sqnLink)) {
      pulseHits = 1; /* 1 pulses for non-critical input links*/
    } else {
      if ((pass && method0) || (pass2 && method02) ||
        (cross && method0 && forbidden) ||
        (cross2 && method02 && forbidden2)){
        pulseHits = 3;
      } else {
        pulseHits = 2;
      }
    }
  }else{ /* one or both of the paired links is critical*/
    if (sqtLinkIsInTwilightZone(sqLink) ||
      sqtLinkIsInTwilightZone(sgnLink)) {
      pulseHits = 15;
    }else{
      pulseHits = 9;
    }
  }
}
```
---

FIG. 6A

```
    } else {
      if (!dbtLinkCritical(link)){
        if (sqtLinkIsInput(sqLink)) {
          pluseHits = 1;
        } else {
          if ((pass && method0) || (cross && method0 && forbidden)){
              pulseHits = 3;
            }else{
              pulseHits = 2;
            }
        }
      }
    }else{
      if (sqtLinkIsLogic(sqLink) && sqtLinkIsInTwilightZone(sqLink)) {
          pulseHits = 15;
        } else {
          pulseHits = 9;
        }
    }
```

| FIG. 6A |
|---------|
| FIG. 6B |

KEY TO FIG. 6

FIG. 6B 5,661,412

REDUCING PROGRAMMING TIME OF A FIELD PROGRAMMABLE GATE ARRAY EMPLOYING ANTIFUSES

FIELD OF THE INVENTION

This invention relates to reducing programming time of programmable devices employing antifuses.

BACKGROUND INFORMATION

It may take approximately one hour to program a user-specific circuit into a field programmable gate array having approximately 800,000 antifuses. This is a significant amount of time which may impact the ability to produce large numbers of programmed field programmable gate arrays. As processing technology improves in the future, the number of antifuses in field programmable gate arrays is anticipated to increase dramatically. A corresponding increase in the amount of time required to program a user-specific circuit into a field programmable gate array would be undesirable and may indeed be prohibitive. Accordingly, techniques are sought for reducing the amount of time required to program the antifuses of a field programmable gate array.

SUMMARY

Techniques are disclosed for determining critical programmed antifuse reliability for different types of antifuses which are programmed using programming circuitry of a field programmable gate array. Antifuses of a field programmable gate array (through which switching currents can flow during normal circuit operation of a user-specific circuit programmed into the field programmable gate array) are then classified into three or more classes. A first class contains antifuses which if programmed with a first programming time would have a critical programmed antifuse reliability. A second class contains antifuses which if programmed with a second programming time would have the critical programmed antifuse reliability but if programmed with the first programming time would not have the critical programmed antifuse reliability. A third class contains antifuses which if programmed with a third programming time would have the critical programmed antifuse reliability but if programmed with either the first or second programming time would not have the critical programming antifuse reliability. The antifuses in the first class are programmed with the first programming time, the antifuses in the second programming class are programmed with the second programming time, and the antifuses in the third class are programmed with the third programming time.

In a specific embodiment, antifuse characteristics including: antifuse type (for example: output, input, tie high low, pass, cross, routing area, zone), programming method, and whether or not the antifuse is determined to be a critical antifuse are taken into account in classifying antifuses. This summary does not purport to define the invention. The invention is defined by the appended claims.

BRIEF DESCRIPTION OF THE DRAWINGS

FIG. 6 is a software listing in accordance with a specific embodiment.

DETAILED DESCRIPTION OF THE PREFERRED EMBODIMENTS

Figure 1:
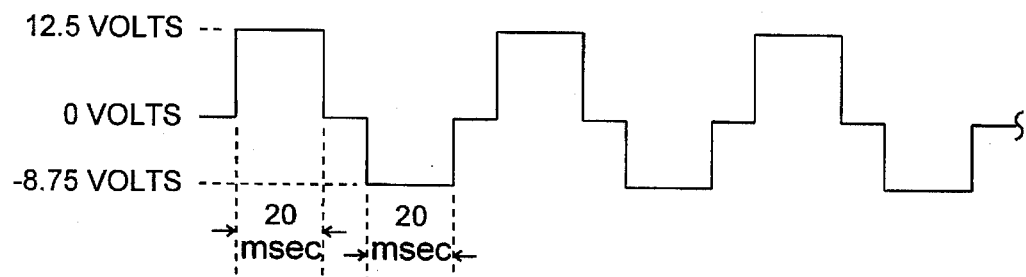
FIG. 1 is a diagram illustrating a programming voltage waveform used to program amorphous silicon antifuses.

In order to reduce the programming time of antifuses on a field programmable gate array, antifuses of a field programmable gate array are studied to determine a minimum programming time required to program an antifuse to critical reliability which has a given programming current and operating current. In accordance with one embodiment, a vertical metal-to-metal amorphous silicon antifuse structure of the type disclosed in U.S. patent application Ser. No. 07/892,466, filed Jun. 1, 1992 (the subject matter of which is incorporated herein by reference) is programmed by supplying a programming voltage waveform of the type shown in FIG. 1 to the programming circuitry of a field programmable gate array such that a programming current pulses through the antifuse. The polarity of the programming pulses is such that +12.5 volts output by the programming driver of the programming circuitry during the first programming pulse is coupled to the lower antifuse electrode and such that −8.75 volts output by the programming driver during the second programming pulse is coupled to the lower antifuse electrode. The magnitude of the programming current which actually pulses through the antifuse being programmed in this embodiment is of course dependent upon the resistance of the programming circuitry on the field programmable gate array which conducts the programming current to and from the antifuse. The magnitude of the programming current (for example, the magnitude of the programming current during the last +12.5 volt pulse applied to the antifuse) is recorded. The total programming time is also recorded. If, for example, two periods of a 20 millisecond +12.5 volt pulse and a 20 millisecond −8.75 volt pulse are applied, then 80 milliseconds may be recorded as the total programming time to program the antifuse.

With the programming current and programming time of the particular antifuse recorded, the antifuse is subjected to a stress test. In one embodiment, a switching digital logic signal is made to pass through the antifuse at worst case stress voltage and worst case temperature conditions for a significant period of time. After this stressing of the antifuse, a circuit programmed into the field programmable gate array employing the antifuse is tested. If the circuit operates correctly, then it is determined that the antifuse still has an adequately low resistance to be considered a properly programmed antifuse. In one embodiment, the worst case stress supply voltage is 6.0 volts, the worst case operating supply voltage is about 5.5 volts, the worst case temperature is about −55 degrees Celsius, the stress testing time is about 1000 hours. If the antifuse is determined to be properly programmed after the stress test, then the total programming time is decreased by reducing the number of periods of programming pulses and the stress test is repeated on a like antifuse. This testing of like antifuses continues until antifuses begin failing the stress test. The total programming time and the programming current where the antifuses begin failing the stress test is considered to be a critical programmed reliability data point.

After a critical programmed reliability data point is obtained for the first programming current, an antifuse disposed in a different location on the field programmable gate arrays is programmed. The programming current should be different due to the different resistance associated with the different programming circuitry through which the programming current must pass to reach the antifuse. Again, multiple like antifuses are programmed and stress tested with this different programming current until a critical programmed reliability data point is obtained for the different programming current. This process is repeated for numerous programming currents until a critical reliability line can be graphed versus programming current and programming time.

Figure 2:
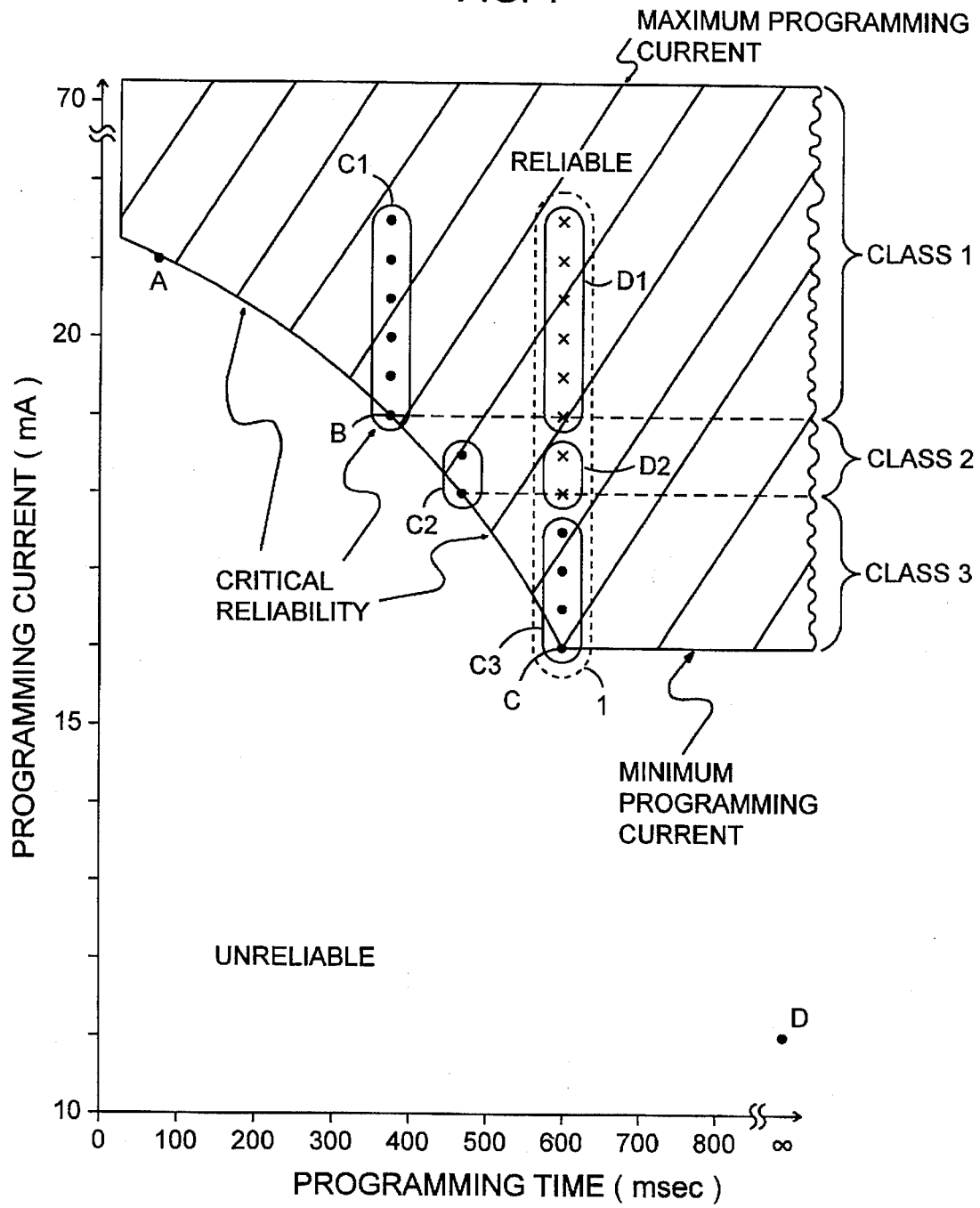
FIG. 2 is a graph illustrating a critical reliability line in accordance with an embodiment of the present invention.

FIG. 2 is a graph showing a critical reliability line with respect to programming current and programming time for an amorphous silicon antifuse structure. Three data points A, B and C help define the critical reliability line. As indicated in FIG. 2, a maximum programming current of 70 mA is established in the specific embodiment discussed. This maximum programming current in the specific embodiment is determined in part by the architecture of the programming circuitry of the field programmable gate array. The high programming voltages which would be required to program some antifuses to more than 70 mA may result in breakdown of and/or damage to certain structures on the field programmable gate array. The maximum programming current is therefore set below the 70 mA value. As indicated in FIG. 2, a minimum programming current may also be established. In the specific embodiment, 16 mA is the minimum programming current. A region on the graph of FIG. 2 is therefore obtained wherein reliable antifuse programming will take place. This region is bounded on one side by the critical programmed reliability line.

If, for example, only one programming pulse waveform having one total programming time were used to program all antifuses to be programmed on a field programmable gate array, then some antifuses may be programmed with more programming time than would be required to program them to critical reliability. Because the antifuses to be programmed to realize a user-specific circuit will typically be spread throughout the field programmable gate array, the resistances of the programming circuitry available to program individual antifuses will typically vary. Accordingly, the programming currents will typically also vary.

Data points 1 represent multiple antifuses on a field programmable gate array that could all be reliably programmed with a total programming time of 600 milliseconds. Note that many of the antifuses could be programmed with less total programming time while still meeting the critical reliability standard. The antifuses represented by data points C1, for example, represent the antifuses D1 programmed with a total programming time of 360 milliseconds rather than 600 milliseconds. Similarly, the antifuses represented by data points C2 represent the antifuses D2 programmed with 460 milliseconds of total programming time rather than 600 milliseconds.

In accordance with one embodiment, antifuses to be programmed (through which a switching current can flow during normal circuit operation) are classified into three or more classes before programming. As shown in FIG. 2, class 1 in the specific embodiment contains antifuses which will be programmed with programming currents in a range of between 70 mA and 19 mA. Class 2 contains antifuses which will be programmed with programming currents in a range between 19 mA to 18 mA. Class 3 will be programmed with programming currents in a range of between 18 mA and 16 mA. The antifuses of Class 1 are programmed with 360 milliseconds of total programming time, the antifuses of Class 2 are programmed with 460 milliseconds of total programming time, and the antifuses of Class 3 are programmed with 600 milliseconds of total programming time. Accordingly, it is seen that the total amount of time required to program all the antifuses to be programmed is reduced while critical programmed antifuse reliability is maintained.

Figures 3, 4:
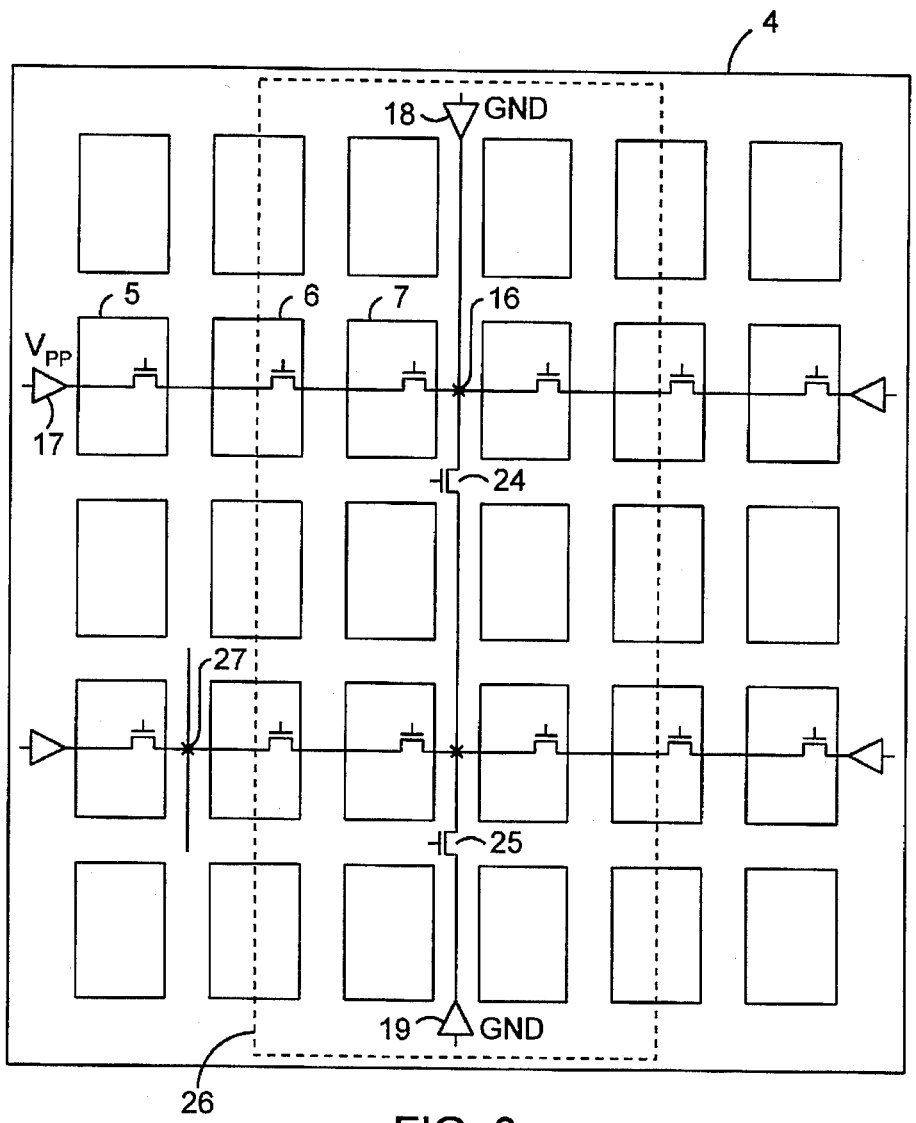
FIG. 3 is a simplified top-down diagram of a field programmable gate array integrated circuit illustrating a "zone" in accordance with an embodiment of the present invention.
FIG. 4 is a simplified top-down diagram of a part of the field programmable gate array integrated circuit of FIG. 3.
Figure 5:
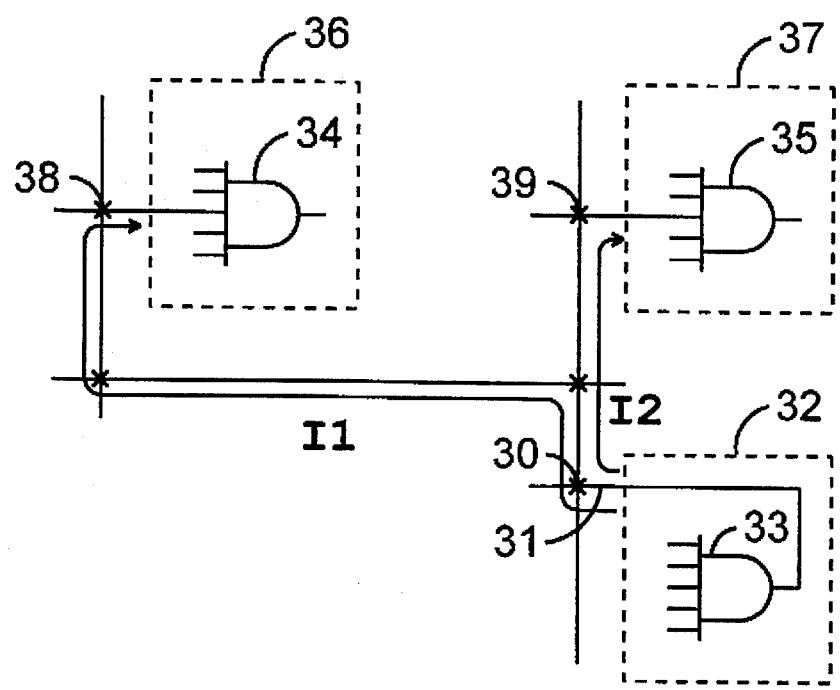
FIG. 5 is a diagram illustrating current flow through an output antifuse in accordance with an embodiment of the present invention.

FIGS. 3, 4 and 5 are provided to illustrate a more involved classification of antifuses in accordance with another embodiment. The classification scheme is first set forth using the pseudocode set forth below and then the meanings of terms used in the pseudocode are discussed.

If "not critical", then if "input", then program with 1 period of 20 msec pulse duration, else if (("pass routing area" AND "no multi-branch") OR ("cross routing area" AND "no multi-branch" AND "in zone")), then program with 3 periods of 30 msec duration, else program with 2 periods of 30 msec duration.

If "critical" then if ("output" AND "in zone"), then program with 15 periods of 20 msec duration, else program with 9 periods of 20 msec duration.

It has been discovered that critical antifuse reliability of a metal-to-metal amorphous silicon antifuse is a function of programming current, operating current and total programming time. The electrical characteristics of a programmed amorphous silicon antifuse programmed with too little programming current with respect to the amount of operating current flowing through the antifuse during normal circuit operation may change. Accordingly, an antifuse is called "critical" if the operating current (either estimated via simulation or actual as measured) flowing through the antifuse during normal circuit operation exceeds a predetermined percentage (for example, 25 percent) of the programming current used to program the antifuse. As seen from the above pseudocode, a critical antifuse is programmed with more total programming time than a similar type of antifuse that is not critical. Accordingly, there are in effect multiple critical reliability lines for different operating current conditions.

An "input" antifuse is an antifuse which is contacting an input conductor of a module. FIG. 3 is a simplified top-down diagram of a field programmable gate array integrated circuit 4 array employing antifuses. For additional details on such a field programmable gate array, see: U.S. Pat. No. 5,416,367, U.S. Pat. No. 5,424,655, and the 1994 QuickLogic Databook. The contents of these documents are incorporated herein by reference. The smaller boxes represent modules of digital logic elements. FIG. 4 is a simplified top-down diagram of three modules 5–7. The conductors 8–11 extending to the left from the AND gates of the modules are input conductors. The Xs in FIG. 4 denote antifuses. Antifuses 12, for example, are "input" antifuses.

A "pass" antifuse is an antifuse which is programmable to couple collinear conductors together end to end. Antifuse 13 is a pass antifuse which is programmable to couple collinear conductors 14 and 15 together. The areas between modules contain routing interconnect and are therefore called the "routing area" of the field programmable gate array. The term "pass routing area" antifuse in the pseudocode above refers to a pass antifuse disposed in the routing are.

To increase the programming current with which an antifuse is programmed, "multi-branch"(sometimes called "multi-path") programming techniques such as those disclosed in U.S. Pat. No. 5,327,024 (the subject matter of which is incorporated herein by reference) are employed. If, for example, antifuse 16 is to be programmed (see FIG. 4), then a first programming path may extend from programming driver 17 (see FIG. 3) on the left side of the integrated circuit 4 to the right to antifuse 16, a second programming path may extend from programming driver 18 on the top of the integrated circuit 4 downward to antifuse 16, and a third programming path may extend from programming driver 19 on the bottom of the integrated circuit 4 upward to antifuse 16. Multi-branch programming is programming whereby three or more programming branches are used in the programming of an antifuse. The term "no multi-branch" in the pseudocode above therefore refers to antifuses which will not be programmed using a multi-branch programming method.

A "cross" antifuse is an antifuse which is programmable to couple two perpendicular extending conductors together where one extends over the other. Accordingly, the term "cross routing area" in the pseudocode above refers to antifuses such as antifuses 20.

If, for example, antifuse 16 were to be programmed in the architecture illustrated in FIG. 3, then multi-branch programming may be employed using one programming driver on the closest of the left and right sides of the integrated circuit and using two programming drivers, one on the top and one on the bottom of the integrated circuit. As illustrated in FIG. 4, three programming transistors 21–23 must be made conductive to couple programming driver 17 through three modules 5–7 to antifuse 16. Such programming transistors are generally the dominant components of resistance in the current branch which crosses modules. The number of modules which the programming current must pass (which is the number of programming transistors through which the programming current must pass in the illustrated embodiment) can therefore be taken as an indication of the resistance of the programming current branch. Because the resistance of the programming current branch limits the programming current, the number of modules can also be taken as an indication of the magnitude of the programming current which will flow through the antifuse. The left programming driver is used if it is separated from the antifuse to be programmed by fewer modules than the right programming driver. Similarly, the right programming driver is used if it is separated from the antifuse to be programmed by fewer modules than the left programming driver.

In the vertical dimension, two programming current branches are employed in parallel (electrically in parallel) when multi-branch programming is used. The additional vertical programming branch serves to reduce the resistance from the antifuse to programming drivers 18 and 19. Moreover, there are generally fewer programming transistors (such as programming transistors 24 and 25) per the number of modules crossed in the vertical dimension. As a result, the classification of antifuses may disregard the effect of the vertical programming transistors and therefore the location of the antifuse in the vertical dimension. A "zone" of the field programmable gate array is therefore defined in one embodiment as:

[(number of modules from left)−(number of modules from right)]÷2=Q, where the antifuse is in the "zone" if: $-1 \leq Q \leq 1$.

The dashed box 26 in FIG. 3 illustrates this "zone". There are three modules between antifuse 16 and the left side of the field programmable gate array and there are three modules between antifuse 16 and the right side of the field programmable gate array. Q is therefore 0 and antifuse 16 is determined to be in the zone. There is one module between antifuse 27 and the left side of the field programmable gate array and there are five modules between antifuse 27 and the right side of the field programmable gate array. Q is therefore −2 and antifuse 27 is not in the zone. The term "in zone" in the pseudocode above refers to the antifuse being in such a zone.

An "output" antifuse is an antifuse which is contacting an output conductor of a module. Conductor 28 is coupled to an output of the digital logic element in module 5 and is therefore an output conductor of module 5. Antifuses 29 are contacting output conductor 28 and therefore are "output" antifuses for purposes of the pseudocode above. The designation of an output antifuse is important because an output antifuse tends to have more operating current flowing through it during normal circuit operation than does an input antifuse.

FIG. 5 illustrates an output antifuse 30 contacting an output conductor 31 of a module 32. The output lead of digital logic element 33 of module 32 is to be coupled to the input leads of digital logic elements 34 and 35 of modules 36 and 37, respectively. As illustrated, current I1 flows to module 36 through input antifuse 38 and current I2 flows to module 37 through input antifuse 39 but both currents I1 and I2 flow through output antifuse 30. An output antifuse is therefore assumed to be likely to conduct a greater amount of current during normal circuit operation than is an input antifuse. In keeping with the observation mentioned above that the electrical characteristics of a programmed antifuse may change if the operating current is too great a percentage of the programming current, the fact that an antifuse is an output antifuse is used in classifying antifuses.

In this embodiment, after the antifuses are classified in accordance with the pseudocode set forth above, each antifuse is programmed according to the class into which it is classified. Note that there are five programming classes in this embodiment: a 40 millisecond total programming time class, a 180 millisecond total programming time class, a 120 millisecond total programming time class, a 600 millisecond total programming time class, and a 360 millisecond total programming time class.

It is to be understood, however, that the above classification is but one possible classification in accordance with the present invention. Antifuse characteristics other than antifuse type (for example: output, input, tie high low, pass, cross, routing area, zone), programming method, and operating current could be taken into account in a classification. A class in some embodiments may contain antifuses which will be programmed with significantly different programming currents and/or will operate with significantly different operating currents so long as all the antifuses of the class will achieve the critical programmed reliability when programmed with roughly the same amount of programming time. In other embodiments, antifuse classes are optimized to speed execution of the software which makes the classification such that the programming current range for one class of antifuses having a given operating current overlaps somewhat with the programming current range for another class of antifuses having the same operating current.

In some field programmable gate array architectures there are antifuses ("tie high low antifuses") which are programmed but through which negligible switching current flows when the user-specific circuit programmed into the field programmable gate array is in normal circuit operation. These "tie high low" antifuses generally couple a logic device input to either digital high (Vcc) or to digital low (ground) in order to disable or enable the input. An active low asynchronous clear input of a flip-flop may, for example, be tied high such that the flip-flop is not asynchronously cleared during normal circuit operation. In some embodiments, these "tie high low" antifuses form a separate class which is programmed with a very small total programming time such as 5 milliseconds.

In some embodiments, a sequencer such as that described in U.S. patent application Ser. No. 08/349,092 filed Dec. 1, 1994 (the subject matter of which is incorporated herein by reference) is employed so that multiple antifuses are programmed simultaneously. Such simultaneously programmed antifuses will all be programmed with the same total programming time. In order to perform such simultaneous antifuses programming, an antifuse of a first class which could be reliably programmed with less total programming time could be grouped for simultaneous programming with an antifuse of a second class which requires a greater amount of total programming time. In such a case, both antifuses will be programmed with the greater amount of programming time.

Although the present invention is described in connection with certain specific embodiment for instructional purposes, the present invention is not limited thereto. Above described methods can be applied to antifuse structures which do not include amorphous silicon and to programmable devices other than field programmable gate arrays. Other methods may be employed to determine critical programmed reliability with respect to programming time. In some embodiments, an antifuse may be classified based on the fanout of the net downstream of the antifuse. An antifuse having a high downstream fanout would typically be indicative of a larger switching antifuse operating current as opposed to an antifuse having a low downstream fanout which would typically be indicative of a smaller switching antifuse operating current. Any suitable circuit simulation technique can be used to estimate operating current for purposes of determining whether an antifuse is critical or not. Accordingly, various modifications, adaptations, and combinations of various features of the described embodiments can be practiced without departing from the scope of the invention as set forth in the following claims.

What is claimed is:

1. A method, comprising:
    programming each one of a plurality of antifuses of a first type with a different programming time and determining a minimum total programming time A required to program antifuses of said first type to a critical programmed antifuse reliability;
    programming each one of a plurality of antifuses of a second type with a different programming time and determining a minimum total programming time B required to program antifuses of said second type to a critical programmed antifuse reliability; and
    programming each one of a plurality of antifuses of a third type with a different programming time and determining a minimum total programming time C required to program antifuses of said third type to a critical programmed antifuse reliability, wherein A<B<C.

2. The method of claim 1, wherein each of said antifuses of said first type which is programmed is programmed using programming circuitry of a field programmable gate array, wherein each of said antifuses of said second type which is programmed is programmed using programming circuitry of a field programmable gate array, and wherein each of said antifuses of said third type which is programmed is programmed using programming circuitry of a field programmable gate array.

3. The method of claim 1, wherein said antifuses of said first type, of said second type, and of said third type which are programmed in the method of claim 1 are antifuses on a plurality of field programmable gate arrays of like architecture.

4. The method of claim 1, wherein said antifuses of said first type, of said second type, and of said third type which are programmed in the method of claim 1 are metal-to-metal antifuses comprising amorphous silicon.

5. The method of claim 1, wherein whether an antifuse is an antifuse of one type or another type is dependent upon whether said antifuse is an output antifuse.

6. The method of claim 1, wherein whether an antifuse is an antifuse of one type or another type is dependent upon whether said antifuse is an input antifuse.

7. The method of claim 1, wherein whether an antifuse is an antifuse of one type or another type is dependent upon whether said antifuse is a pass antifuse.

8. The method of claim 1, wherein whether an antifuse is an antifuse of one type or another type is dependent upon whether said antifuse is a cross antifuse.

9. The method of claim 1, wherein whether an antifuse is an antifuse of one type or another type is dependent upon whether said antifuse is disposed in a zone of a field programmable gate array.

10. The method of claim 1, wherein whether an antifuse is an antifuse of one type or another type is dependent upon whether said antifuse is disposed in a routing area of a field programmable gate array.

11. The method of claim 1, wherein a determination is made as to whether said antifuse is a critical antifuse.

12. The method of claim 1, wherein whether an antifuse is an antifuse of one type or another type is dependent upon a programming method with which said antifuse will be programmed.

13. The method of claim 1, further comprising stress testing each one of said antifuses of said first type which are programmed in the method of claim 1, stress testing each one of said antifuses of said second type which are programmed in the method of claim 1, and stress testing each one of said antifuses of said third type which are programmed in the method of claim 1.

14. The method of claim 1, further comprising:
    after said three programming steps, classifying antifuses of a field programmable gate array into three classes;
    programming antifuses of said field programmable gate array of a first of said three classes with a first programming time;
    programming antifuses of said field programmable gate array of a second of said three classes with a second programming time; and
    programming antifuses of said field programmable gate array of a third of said three classes with a third programming time.

15. A method, comprising:
    classifying antifuses of a field programmable gate array into three or more classes, said antifuses being antifuses that when programmed can have a switching current flowing through them when a circuit programmed into said field programmable gate array is in normal circuit operation;
    programming each antifuse in a first of said classes with a first programming time such that each antifuse in said first class has at least a critical programmed antifuse reliability when programmed;

programming each antifuse in a second of said classes with a second programming time such that each antifuse in said second class has at least said critical programmed antifuse reliability when programmed, said second of said classes containing at least some antifuses that if programmed with said first programming time would not have said critical programmed antifuse reliability; and programming each antifuse in a third of said classes with a third programming time such that each antifuse in said third class has at least said critical programmed antifuse reliability when programmed, said third of said classes containing at least some antifuses that if programmed with said first programming time or said second programming time would not have said critical programmed antifuse reliability.

16. The method of claim 15, further comprising:

programming each antifuse in a fourth of said classes with a fourth programming time such that each antifuse in said fourth class has at least said critical programmed antifuse reliability when programmed, said fourth of said classes containing at least some antifuses that if programmed with said first programming time or said second programming time or said third programming time would not have said critical programmed antifuse reliability.

17. The method of claim 15, wherein the periods of time required to program the antifuses of said first class to said critical programmed antifuse reliability all fall within a first range, wherein the periods of time required to program the antifuses of said second class to said critical programmed antifuse reliability all fall within a second range, and wherein the periods of time required to program the antifuses of said third class to said critical programmed antifuse reliability all fall within a third range.

18. The method of claim 15, wherein said first programming time is a sum of the durations of a plurality of pulses of a programming current, wherein said second programming time is a sum of the durations of a plurality of pulses of a programming current, and wherein said third programming time is a sum of the durations of a plurality of pulses of a programming current.

19. The method of claim 15, wherein said classifying step involves:

determining whether an antifuse to be classified is disposed within a zone of said field programmable gate array.

20. The method of claim 19, wherein if said antifuse is disposed within said zone then said antifuse is classified into a single class.

21. The method of claim 15, wherein said classifying step involves:

determining whether an antifuse to be classified is an antifuse contacting an output lead of a module.

22. The method of claim 21, wherein if said antifuse is contacting an output lead of a module then said antifuse is classified into a single class.

23. The method of claim 15, wherein said programming with a first programming time involves programming with a first plurality of programming current pulses, wherein said programming with a second programming time involves programming with a second plurality of programming current pulses, and wherein said programming with a third programming time involves programming with a third plurality of programming current pulses.

24. The method of claim 15, wherein said antifuses in said first class are programmed with multiple different programming currents, wherein said antifuses in said second class are programmed with multiple different programming currents, and wherein said antifuses in said third class are programmed with multiple different programming currents.

25. The method of claim 15, wherein said antifuses are metal-to-metal antifuses structures comprising amorphous silicon.

26. The method of claim 16, wherein there are at least one hundred antifuses in said first class, wherein there are at least one hundred antifuses in said second class, wherein there are at least one hundred antifuses in said third class, and wherein there are at least one hundred antifuses in said fourth class.

27. A method, comprising:

programming and testing a plurality of antifuses and thereby obtaining programmed antifuse reliability data;

using said programmed antifuse reliability data to classify antifuses of a field programmable gate array into at least four classes;

programming antifuses in a first of said four classes with a first total programming time to have at least a critical reliability;

programming antifuses in a second of said four classes with a second total programming time to have at least a critical reliability;

programming antifuses in a third of said four classes with a third total programming time to have at least a critical reliability; and programming antifuses in a fourth of said four classes with a fourth total programming time to have at least a critical reliability.

28. The method of claim 27, wherein said antifuses of said field programmable gate array that are classified are antifuses that can have a switching current flowing through them when a circuit programmed into said field programmable gate array is in normal circuit operation.

29. The method of claim 27, wherein said using step further comprises:

determining whether an antifuse to be programmed is disposed in a zone of said field programmable gate array.

30. The method of claim 27, wherein said using step further comprises:

determining whether an antifuse to be programmed is contacting an output lead of a module.

31. The method of claim 28, wherein said programming and testing step further comprises:

programming an antifuse;

stressing said antifuse; and testing whether said antifuse is properly programmed after said stressing.

32. The method of claim 31, wherein said testing involves operating a circuit programmed into a field programmable gate array, said antifuse forming a connection in said circuit.

33. The method of claim 27, wherein there are at least one hundred antifuses in said first of said four classes, wherein there are at least one hundred antifuses in said second of said four classes, wherein there are at least one hundred antifuses in said third of said four classes, and wherein there are at least one hundred antifuses in said fourth of said four classes.

34. A method, comprising:

classifying an antifuse to be programmed into one of two classes depending at least in part on whether said antifuse is disposed in a zone of a field programmable gate array;

programming said antifuse with a first total programming time if said antifuse is classified into a first of said two classes; and programming said antifuse with a second total programming time if said antifuse is classified into a second of said two classes.

35. A method, comprising:

classifying an antifuse to be programmed into one of two classes depending at least in part on whether said antifuse is disposed in a zone of a field programmable gate array;

programming said antifuse with a first total programming time if said antifuse is classified into a first of said two classes; and programming said antifuse with a second total programming time if said antifuse is classified into a second of said two classes, wherein said classifying step involves classifying antifuses of said field programmable gate array into four classes, each class being programmed with a different total programming time, said antifuse being a metal-to-metal antifuse comprising amorphous silicon.

36. A method, comprising:

classifying an antifuse of a field programmable gate array into one of two classes depending at least in part on whether said antifuse will be programmed using a high programming current programming method;

programming said antifuse with a first total programming time if said antifuse is classified into a first of said two classes; and programming said antifuse with a second total programming time if said antifuse is classified into a second of said two classes.

37. A method, comprising:

classifying an antifuse of a field programmable gate array into one of two classes depending at least in part on whether said antifuse will be programmed using a high programming current programming method;

programming said antifuse with a first total programming time if said antifuse is classified into a first of said two classes; and programming said antifuse with a second total programming time if said antifuse is classified into a second of said two classes, wherein said classifying step involves classifying antifuses of said field programmable gate array into four classes, each class being programmed with a different total programming time, said antifuse being a metal-to-metal antifuse comprising amorphous silicon.

38. A method, comprising:

using a plurality of antifuse characteristics to classify antifuses of a field programmable gate array into three or more classes, the antifuse characteristics of an individual antifuse correlating substantially with a programming current with which said individual antifuse will be programmed and/or correlating substantially with an operating current which will pass through said individual antifuse during normal circuit operation, each of said plurality of antifuses which are classified being antifuses through which a switching current can pass during normal circuit operation;

programming all antifuses classified into a first of said four classes with a first total programming time to have at least a critical reliability;

programming all antifuses classified into a second of said four classes with a first total programming time to have at least a critical reliability; and programming all antifuses classified into a third of said four classes with a third total programming time to have at least a critical reliability.

39. The method of claim 38, wherein at least one of said antifuse characteristics is whether or not the antifuse being classified is disposed in a certain region of said field programmable gate array.

40. The method of claim 38, wherein at least one of said antifuse characteristics is whether or not the antifuse being classified is an output antifuse.

41. The method of claim 38, wherein at least one of said antifuse characteristics is whether or not the antifuse being classified is a critical antifuse.

* * * * *